(12) United States Patent
Li et al.

(10) Patent No.: US 10,640,861 B2
(45) Date of Patent: May 5, 2020

(54) EVAPORATION MASK AND EVAPORATION DEVICE

(71) Applicant: BOE Technology Group Co., Ltd., Beijing (CN)

(72) Inventors: Xiaohu Li, Beijing (CN); Zhongyuan Sun, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 602 days.

(21) Appl. No.: 15/291,528

(22) Filed: Oct. 12, 2016

(65) Prior Publication Data

US 2017/0104186 A1 Apr. 13, 2017

(30) Foreign Application Priority Data

Oct. 13, 2015 (CN) .......................... 2015 1 0658127

(51) Int. Cl.
*C23C 14/04* (2006.01)
*H01L 51/56* (2006.01)
*H01L 51/00* (2006.01)

(52) U.S. Cl.
CPC .......... *C23C 14/044* (2013.01); *C23C 14/042* (2013.01); *H01L 51/001* (2013.01); *H01L 51/0011* (2013.01); *H01L 51/56* (2013.01)

(58) Field of Classification Search
CPC ..... C23C 14/044; C23C 4/0005; C23C 14/04; C23C 14/042; C23C 16/04; C23C 16/042; C30B 25/04

(Continued)

(56) References Cited

U.S. PATENT DOCUMENTS 3,574,012 A * 4/1971 Penberg ................ C23C 14/042
                                                              118/504
3,690,635 A * 9/1972 Harker .................. C23C 14/564
                                                              266/149

(Continued)

FOREIGN PATENT DOCUMENTS

CN        1950536 A        4/2007
CN      101988185 A        3/2011

(Continued)

OTHER PUBLICATIONS

Dec. 18, 2017—(CN) Second Office Action Appn 201510658127.7 with English Tran.

(Continued)

*Primary Examiner* — Aiden Lee
(74) *Attorney, Agent, or Firm* — Banner & Witcoff, Ltd.

(57) ABSTRACT

An evaporation mask includes: shielding regions and evaporation regions arranged alternately, and a baffle at least covering the evaporation regions. The shielding regions are provided with shielding parts, and the baffle includes a plurality of evaporation sub-regions, and a plurality of openings are provided in each evaporation sub-region; the plurality of evaporation sub-regions include at least one first evaporation sub-region, and compared to rest evaporation sub-regions, a sum of areas of all openings in a unit area of the first evaporation sub-region is minimum; and the closer an evaporation sub-region to the first evaporation sub-region, the less a sum of areas of all openings in a unit area of the evaporation sub-region.

12 Claims, 3 Drawing Sheets

(58) Field of Classification Search
USPC .................................................. 118/720–721
See application file for complete search history.

(56) References Cited

U.S. PATENT DOCUMENTS

| | | | | |
|---|---|---|---|---|
| 4,776,868 A * | 10/1988 | Trotter, Jr. | ............... | B29C 41/02 264/1.1 |
| 5,415,753 A * | 5/1995 | Hurwitt | ............... | C23C 14/0068 204/192.12 |
| 5,643,428 A * | 7/1997 | Krivokapic | ............. | H01J 37/34 204/192.12 |
| 7,763,320 B2 * | 7/2010 | Yamazaki | ................ | B05D 1/60 134/1.1 |
| 2004/0052942 A1 * | 3/2004 | Bijkerk | ................ | C23C 14/044 427/248.1 |
| 2004/0202821 A1 * | 10/2004 | Kim | ........................ | B32B 3/266 428/137 |
| 2007/0072337 A1 * | 3/2007 | Matsuzaki | ............ | C23C 14/042 438/99 |
| 2008/0000420 A1 * | 1/2008 | Kim | ...................... | C23C 14/042 118/504 |
| 2011/0067630 A1 * | 3/2011 | Ko | ........................ | C23C 14/042 118/721 |
| 2012/0009706 A1 * | 1/2012 | Choi | ..................... | C23C 14/044 438/34 |
| 2013/0181209 A1 * | 7/2013 | Sonoda | ................. | C23C 14/042 257/40 |

FOREIGN PATENT DOCUMENTS

CN          203834004 U     9/2014
CN          204325478 U     5/2015

OTHER PUBLICATIONS

Apr. 7, 2017—(CN) First Office Action Appn 201510658127.7 with English Tran.

* cited by examiner

EVAPORATION MASK AND EVAPORATION DEVICE

This application claims priority to and the benefit of Chinese Patent Application No. 201510658127.7 filed on Oct. 13, 2015, which application is incorporated herein in its entirety.

TECHNICAL FIELD

Embodiments of the present disclosure relate to an evaporation mask and an evaporation device.

BACKGROUND

Because of characteristics of self-illumination, fast response, wide viewing angle, capability of being manufactured on a flexible substrate and the like, organic light emitting diodes (OLEDs) have been applied in the high-performance display field more and more. An OLED comprises a cathode, an anode and a functional layer located between the cathode and the anode. For example, the functional layer comprises an organic light emitting layer and may further comprise a hole injection layer, a hole transport layer, an electron transport layer and an electron injection layer. For the organic light emitting layer, there have been proposed many kinds of film forming methods, comprising an evaporation film forming method, a molecular beam epitaxy method, an organic chemical vapor deposition method, a sol-gel method and the like. The evaporation film forming method has advantages that operation is easy, a film thickness can be easily controlled, pollution to a thin film is small, doping can be achieved easily, and so on, and therefore the evaporation film firming method is generally adopted to form the organic light emitting layer and other organic functional film layers. A process for forming the organic functional layer by using the evaporation film forming method is conducted as follows: in a vacuum environment, an organic material is heated to allow it to be evaporated (sublimed) and then deposited on a target substrate to form a corresponding film layer.

In an evaporation process, the substance evaporated out of the evaporation source is diffused and deposited towards the target substrate in a generally conical radial shape, a problem that the film layer formed on the substrate is not uniform in thickness is caused easily, resulting in that a brightness or color shift occurs to a display panel, and therefore product quality is degraded.

SUMMARY

An embodiment of the present application provides an evaporation mask includes:

shielding regions and evaporation regions arranged alternately, and a baffle at least covering the evaporation regions. The shielding regions are provided with shielding parts, and the baffle includes a plurality of evaporation sub-regions, and a plurality of openings are provided in each evaporation sub-region; the plurality of evaporation sub-regions include at least one first evaporation sub-region, and compared to rest evaporation sub-regions, a sum of areas of all openings in a unit area of the first evaporation sub-region is minimum; and the closer an evaporation sub-region to the first evaporation sub-region, the less a sum of areas of all openings in a unit area of the evaporation sub-region.

For example, the first evaporation sub-region is circular and is located at a center position of the evaporation regions; the rest evaporation sub-regions are annular and concentric with the first evaporation sub-region, and surround the first evaporation sub-region; areas of the annular evaporation sub-regions sequentially farther away from the first evaporation sub-region sequentially increase.

For example, the baffle is fixed to the shielding part through supports, so that there is a gap between the baffle and the shielding part.

For example, a height of the supports is in a range from 15 cm to 30 cm.

For example, an aperture of the openings in the first evaporation sub-region is in a range from 4.5 mm to 6.5 mm.

For example, an aperture of the openings in the rest evaporation sub-regions except the first evaporation sub-region is in a range from 9.5 mm to 10.5 mm.

For example, a thickness of the baffle is in a range from 1.5 mm to 3.5 mm.

For example, a material forming the baffle is a resin material or a metal material, and a tolerable temperature of the resin material or the metal material is greater than or equal to 200° C.

Another embodiment of the present application provides an evaporation device, comprising the evaporation mask according to claim 1.

For example, the evaporation device further comprises an evaporation source, and compared to the shielding part, the baffle is closer to the evaporation source.

BRIEF DESCRIPTION OF THE DRAWINGS

In order to clearly illustrate the technical solution of the embodiments of the disclosure, the drawings needing to be used in the embodiments or relevant technical description will be briefly described in the following; it is obvious that the described drawings are only related to some embodiments of the disclosure, and those skilled in the art can acquire other drawings according to the drawing without any inventive work.

DETAILED DESCRIPTION

The technical solutions of the embodiments of the present disclosure will be described in a clearly and fully understandable way in connection with the drawings in the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Figure 1A:
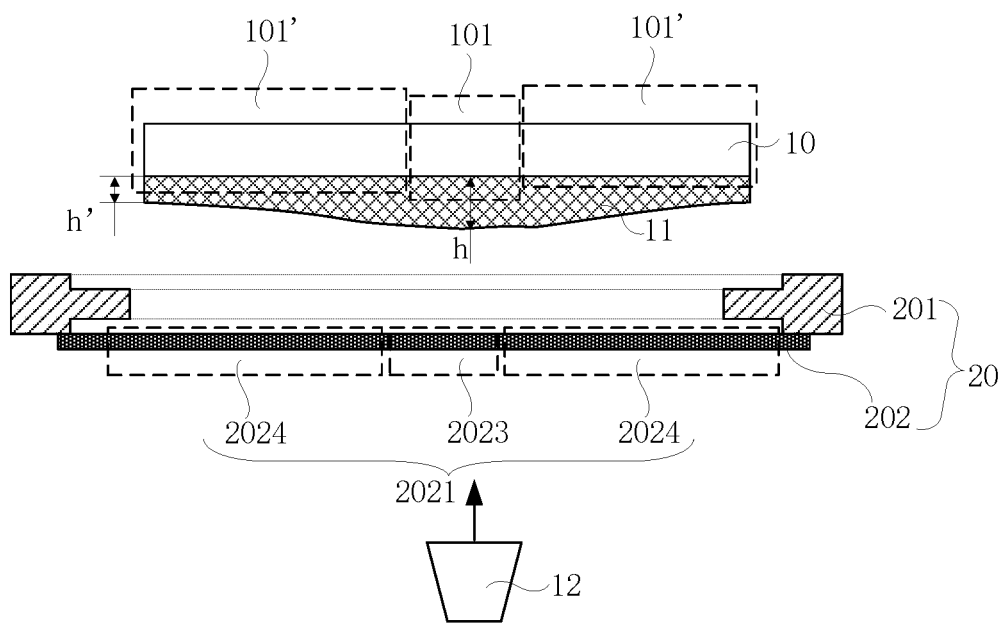
FIG. 1a is a structural schematic diagram of an evaporating device provided by an embodiment of the present disclosure.
Figure 1B:
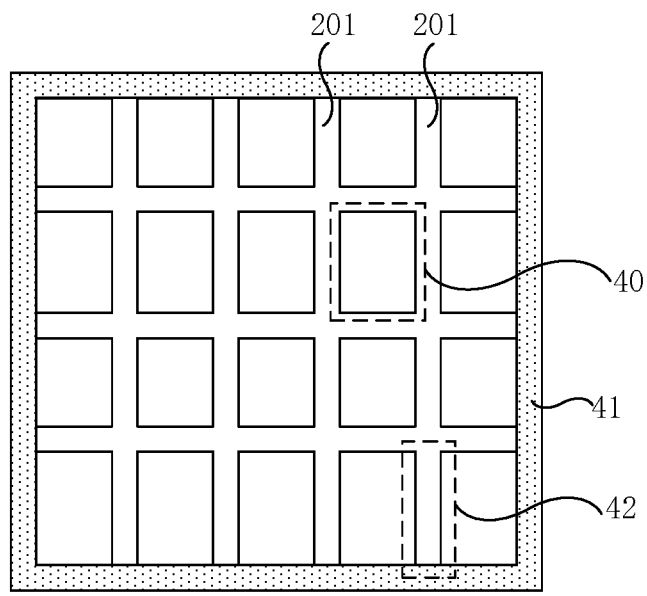
FIG. 1b is a structural schematic diagram of an evaporating mask provided by an embodiment of the present disclosure.

An embodiment of the present disclosure provides an evaporation mask 20, as illustrated in FIG. 1b, comprising shielding regions 42 and evaporation regions 40 which are arranged alternately, the shielding regions 42 are provided with shielding parts 201, and in operation the shielding parts 201 can prevent an evaporation material from arriving at a substrate 10 as illustrated in FIG. 1a. On such basis, as illustrated in FIG. 1a, the evaporation mask 20 further comprises a baffle 202 at least covering the evaporation regions 40.

Figure 2:
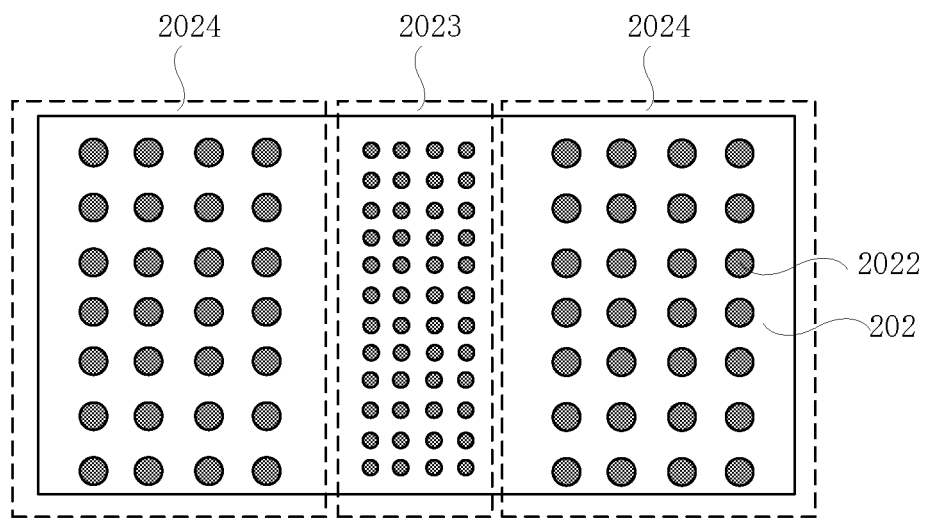
FIG. 2 is a top view of a baffle in the evaporation mask.

For example, the baffle 202 can include a plurality of evaporation sub-regions 2021, and a plurality of openings 2022 are provided in each evaporation sub-region 2021. For example, as illustrated in FIG. 2, the above plurality of evaporation sub-regions 2021 include at least one first evaporation sub-region 2023, and compared to the rest evaporation sub-regions 2024, and the sum of areas of all openings 2022 in a unit area of the first evaporation sub-region 2023 is minimum. That is to say, the sum of areas of all openings 2022 in a unit area of any of the rest evaporation sub-regions 2024 is greater than the sum of areas of all the openings 2022 in the unit area of the first evaporation sub-region 2023. The above rest evaporation sub-regions 2024 are the evaporation sub-regions 2024 in the plurality of evaporation sub-regions 2021 except the first evaporation sub-region 2023. In this way, in operation of evaporation an evaporation material passing through the unit area of the first evaporation sub-region 2023 and reaching the substrate 10 is the least.

For example, the closer an evaporation sub-region 2024 to the first evaporation sub-region 2023, the less the sum of areas of all openings 2022 in a unit area of the evaporation sub-region 2024. In this way, in operation of evaporation the amount of an evaporation material passing through the unit area of the evaporation sub-region 2024 closer to the first evaporation sub-region 2023 is smaller, and the amount of an evaporation material passing through the unit area of the evaporation sub-region 2024 farther away from the first evaporation sub-region 2023 is greater.

What needs to be explained is that, in a case that the evaporation mask provided by the embodiment of the present disclosure is not adopted, in a process of depositing a thin film layer 11, because the substance evaporated out of an evaporation source 12 is diffused during moving towards the substrate 10 and deposited in a conical radial shape, the phenomenon that the thin film layer 11 formed on the substrate 10 is not uniform in thickness can be caused easily. As illustrated in FIG. 1a, in the case that the evaporation mask provided by the embodiment of the present disclosure is not adopted, the thin film layer 11 on the substrate 10 can have a plurality of film forming regions 101 different in thickness. For example, in FIG. 1a, the thickness h' of the thin film layer 11 in a film forming region 101' is smaller than the thickness h of the thin film layer 11 in a film forming region 101.

In the embodiment of the present disclosure, in an evaporation process, each evaporation sub-region 2021 of the baffle 202 and one film forming region 101 of the substrate 10 correspond to each other up and down in the vertical direction. For example, the first evaporation sub-region 2023 corresponds to the thickest film forming region 101 of the thin film layer 11 if the evaporation mask according to the embodiment of the present disclosure is not adopted. Thus, when the evaporation mask according to the embodiment of the present disclosure is adopted, because the sum of all the openings 2022 in a unit area of the first evaporation sub-region 2023 is minimum compared to the rest evaporation sub-regions 2024, the amount of the evaporation material passing through the first evaporation sub-region 2023 in a unit area become minimum, which can reduce the thickness of the thin film layer in the film forming region 101 corresponding to the position of the first evaporation sub-region 2023.

Figure 3:
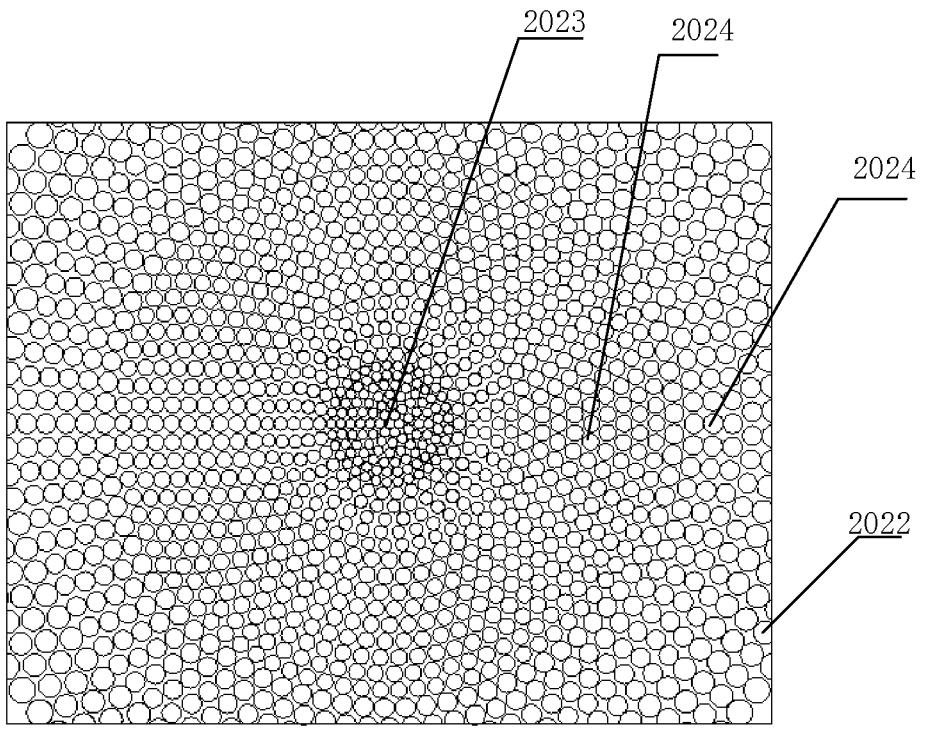
FIG. 3 is an another top view of the baffle in the evaporation mask.

What needs to be explained is that, in the case that the evaporation mask provided by the embodiment of the present disclosure is not adopted, in operation the thickest positions of thin film layers 11 located on different substrates 10 in different evaporation devices may be different, for example, the thickest film forming region 101 of the thin film layer 11 is located at the center position of the substrate 10. In such case, for example, as illustrated in FIG. 3, the first evaporation sub-region 2023 is circular and located at the center position of the evaporation regions 40, and the rest evaporation sub-regions 2024 are annular and concentric with the first evaporation sub-region 2023 and surround the first evaporation sub-region 2023. Further, the areas of the annular evaporation sub-regions 2024 sequentially farther away from the first evaporation sub-region 2023 sequentially increase. In this way, because the areas of the annular evaporation sub-regions 2024 sequentially farther away from the first evaporation sub-region 2023 sequentially increase, the amount of the evaporation material passing through the annular evaporation sub-regions 2024 sequentially farther away from the first evaporation sub-region 2023 sequentially increase, and the thicknesses of the rest film forming regions 101' gradually farther away from the thickest film forming region 101 of the thin film layer 11 are gradually increased, so that the thickness difference of the thin film layer 11 in different film forming regions 101 on the substrate 10 is reduced, which makes the thickness of the thin film layer 11 on the substrate more uniform.

Of course, the above is only an example for the distribution or arrangement of the openings 2022 in the baffle 202 when the first evaporation sub-region 2023 is located at the center position of the evaporation regions 40. When the first evaporation sub-region 2023 is located at other positions than the center position, the distribution of the openings 2022 in the baffle 202 become different accordingly and are not repeated one by one herein.

What needs to be explained is that, the distribution situation of the openings 2022 in the evaporation sub-regions 2021 is not defined or limited by the embodiment of the present disclosure, and the openings can be uniformly distributed or can be set or designed according to requirements, as long as it can be guaranteed that the sum of areas all the openings 2022 in a unit area of the first evaporation sub-region 2023 is minimum compared to the rest evaporation sub-regions 2024, and the closer an evaporation sub-region 2024 to the first evaporation sub-region 2023, the less the sum of areas of all openings 2022 in a unit area of the evaporation sub-region 2024.

What needs to be explained is that, the baffle 202 at least covers the evaporation regions 40, which can refer to the situation that each evaporation region 40 is respectively provided with one baffle 202, or that all the shielding regions 42 and all the evaporation regions 40 are covered by same one baffle 202.

An embodiment of the present disclosure provides an evaporation mask, comprising shielding regions and evaporation regions arranged alternately, the shielding regions are provided with shielding parts, and the evaporation mask further comprises a baffle at least covering the evaporation regions. The baffle includes a plurality of evaporation sub-regions, and a plurality of openings are provided in each evaporation sub-region. The above plurality of evaporation sub-regions include one first evaporation sub-region, and compared to the rest evaporation sub-regions, the sum of areas of all openings in a unit area of the first evaporation sub-region is minimum. The closer an evaporation sub-region to the first evaporation sub-region, the less the sum of areas of all openings in a unit area of the evaporation sub-region.

In this way, when the first evaporation sub-region corresponds to the thickest position of the thin film layer which is obtained if the evaporation mask according to the embodiment of the present disclosure is not adopted, because the sum of areas of all the openings in the unit area of the first evaporation sub-region is minimum compared to the rest evaporation sub-regions, the amount of the evaporation material passing through a unit area of the first evaporation sub-region is minimum. Besides, because the closer an evaporation sub-region to the first evaporation sub-region, the less the sum of areas of all the openings in a unit area of the evaporation sub-region, the amount of the evaporation material passing through a unit area of the evaporation sub-region closer to the first evaporation sub-region is smaller, and the amount of the evaporation material passing through a unit area of the evaporation sub-region farther away from the first evaporation sub-region is greater. Thus, with regard to a position where the thin film layer on the substrate is formed thicker if the evaporation mask according to the embodiment of the present disclosure is not adopted, in the case that the evaporation mask according to the embodiment of the present disclosure is used for performing evaporation, the thickness of the thin film layer is reduced to a certain extent; with regard to a position where the thin film layer on the substrate is formed thinner if the evaporation mask according to the embodiment of the present disclosure is not adopted, in the case that the evaporation mask according to the embodiment of the present disclosure is used for performing evaporation, the thickness of the thin film layer is increased to a certain extent. Thus, the thickness difference of the evaporation thin film layer is reduced, and thickness uniformity of the thin film layer is improved.

As mentioned above, the evaporation mask provided by the embodiment of the present disclosure further comprises the baffle 202. A setting manner or design of the baffle 202 is illustrated in detail as follows.

For example, in a case that each evaporation region 40 is provided with one baffle 202, as illustrated in FIG. 1a, the baffles 202 are fixed to the shielding parts 201 on the outer sides of the evaporation regions 40. For example, the baffles 202 can be bonded to the surfaces of the shielding parts 201 on the side close to or away from the evaporation source 12 by adhesive. For example, grooves are opened in the surfaces of the shielding parts 201 on the side close to or away from the evaporation source 12, protrusions are arranged on the surfaces of the baffles 202 on the side opposite to the shielding parts 202, so that the above protrusions can be clamped in the above grooves to fix the baffles 202.

For example, in a case that all the shielding regions 40 and all the evaporation regions 40 are covered with same one baffle 202, the baffle 202 can be bonded to a frame 41 (as illustrated in FIG. 1b) formed by the shielding part 201 located on an outmost circle (periphery) by adhesive, or the baffle 202 is clamped to the frame 41 in a clamping manner.

Figure 4:
FIG. 4 is a structural schematic diagram of an evaporating mask provided with supports.

For example, as illustrated in FIG. 4, the baffle 202 is fixed to the shielding part 201 through supports 30 or posts, such that a gap is left between the baffle 202 and the shielding part 201. For example, with regard to the case that each evaporation region 40 is provided with one baffle 202, the support 30 and the shielding part 201 can be of an integral structure, and then one side surface of the baffle 202 opposite to the shielding part 201 is bonded to or clamped to the supports 30; or the supports 30 and the baffle 202 can be of an integral structure, and then side surfaces of the supports 30 opposite to the shielding part 201 are bonded to or clamped to the shielding part 201; or, the shielding part 201, the supports 30 and the baffle 202 are independent parts respectively, one end of each support 30 is firstly bonded to or clamped to the shielding part 201, and then the other end of each support 30 is bonded to or clamped to one side surface of the baffle 202 opposite to the shielding part 201 to fix the baffle 202.

For example, in the case that all the shielding regions 42 and all the evaporation regions 40 are covered with same one baffle 202, the supports 30 and the frame 41 as illustrated in FIG. 1b can be of an integral structure, then one side surface of the baffle 202 opposite to the shielding part 201 is bonded to or clamped to the supports 30; or the supports 30 and the baffle 202 can be of an integral structure, and then side faces of the supports 30 opposite to the shielding part 201 are bonded to or clamped to the frame 41; or the frame 41, the supports 30 and the baffle 202 are independent parts respectively, one end of each support 30 is firstly bonded to or clamped to the frame 41, then the other end of each support 30 is bonded to or clamped to one side surface of the baffle 202 opposite to the shielding part 201, so that the baffle 202 can be fixed to the shielding part 202.

For example, the height L of the supports 30 can be in the range from 15 cm to 30 cm. When the height L of the supports 30 is smaller than 15 cm, the height of the supports 30 is too small, such that the baffle 202 is too close to the substrate 10 to let the thin film layer 11 formed on the substrate 10 easily have patterns consistent or similar with shapes of the openings 2022 in the baffle 202 in the evaporation process. However, when the height of the supports 30 is greater than 30 cm, the space size of an evaporation device can be increased, which is unfavorable for saving a production space. For example, the supports 30 can be telescopic rods, so that the height L can be adjusted within the range from 15 cm to 30 cm.

For example, in order to avoid that the baffle 202 is too close to the substrate 10 to render the thin film layer 11 formed on the substrate 10 to easily have the patterns consistent or similar with the shapes of the openings 2022 in the baffle 202 in the evaporation process, the baffle 202 can be arranged on one side surface of the shielding part 201 close to the evaporation source 12.

For example, the thickness B of the above baffle 202 can be 1.5 mm to 3.5 mm. When the thickness B of the baffle 202 is smaller than 1.5 mm, the higher processing precision is needed, which thus increases manufacturing difficulty and manufacturing cost. When the thickness B of the baffle 202 is greater than 3.5 mm, the openings 2022 in the baffle 202 are deep, which thus can increase the contact area between an evaporation material and the openings 2022 and make more evaporation material attached to walls of the openings 202, and waste of the evaporation material is caused. Furthermore, when the thickness B of the baffle 202 is greater than 3.5 mm, the space size of the evaporation device can be increased, which does not facilitate saving of the production space.

For example, the material of the baffle 202 can be a resin material or a metal material. For example, the tolerable temperature of the resin material or the metal material is greater than or equal to 200° C., and therefore in the high-temperature evaporation process, it can be avoided the consequence that, because an evaporation temperature is too high, the service life of the baffle 202 is shortened.

What needs to be explained is that, in an ideal state, in a process of evaporating the thin film layer 11 on the substrate 10, the thin film layer 11 has an ideal value of thickness uniformity, and the ideal valve can be called a thickness threshold here.

In such case, with regard to the first evaporation sub-region 2023, an aperture of the openings 2022 in the first evaporation sub-region 2023 can be 4.5 mm to 6.5 mm. When the aperture of the openings 2022 is smaller than 4.5 mm, too little evaporation material passes through the openings 2022, and therefore the actual thickness of the formed thin film layer 11 is far less than the thickness threshold. When the aperture of the openings 2022 is greater than 6.5 mm, the actual thickness of the formed thin film layer 11 is far greater than the thickness threshold. Thus, with regard to the first evaporation sub-region 2023, when the aperture of the openings 2022 in the first evaporation sub-region 2023 is within the range from 4.5 mm to 6.5 mm, the difference value between the actual thickness of the thin film layer 11 and the thickness threshold is small.

Besides, with regard to the rest evaporation sub-regions 2024 except the first evaporation sub-region 2023, an aperture of the openings 2022 in the evaporation sub-regions 2024 is in the range from 9.5 mm to 10.5 mm. When the aperture of the openings 2022 is smaller than 9.5 mm, too little evaporation material passes through the openings 2022, and therefore the actual thickness of the formed thin film layer 11 is far smaller than the thickness threshold. When the aperture of the openings 2022 is greater than 10.5 mm, the actual thickness of the formed thin film layer 11 is far greater than the thickness threshold. Thus, with regard to the rest of the evaporation sub-regions 2024 except the first evaporation sub-region 2023, when the aperture of the openings 2022 in the above evaporation sub-regions 2024 is within a range from 9.5 mm to 10.5 mm, the difference value between the actual thickness of the thin film layer 11 and the thickness threshold is small.

Besides, the embodiment of the present disclosure does not define or limit shapes of the openings 2022, and the shapes can comprise circles, rectangles, triangles or other irregular shapes. In order to simplify manufacturing, for example, the shapes of the openings 2022 can be simple circles or rectangles.

An embodiment of the present disclosure provides an evaporation device, comprising any one evaporation mask as mentioned above provided by the above-mentioned embodiments and having the same structure and the same advantageous effects as the evaporation mask. The structure and advantageous effects of the evaporation mask haven been described in detail in the above-mentioned embodiments and will not be repeated herein.

Besides, as illustrated in FIG. 1a, the evaporation device further comprises an evaporation source 12. In such case, in order to avoid that the baffle 202 is too close to the substrate 10 in operation of deposition to make the thin film layer 11 formed on the substrate 10 easily have the patterns consistent or similar with shapes of openings 2022 in the baffle 202 in an evaporation process, the baffle 202 can be arranged on the side close to the evaporation source 12 with respect to a shielding part 201. That is to say, the baffle 202 is arranged on one side surface of the shielding part 201 opposite to the evaporation source 12.

The foregoing embodiments merely are exemplary embodiments of the disclosure, and not intended to define the scope of the disclosure, and the scope of the disclosure is determined by the appended claims.

The present application claims priority of Chinese Patent Application No. 201510658127.7 filed on Oct. 13, 2015, the present disclosure of which is incorporated herein by reference in its entirety as part of the present application.

What is claimed is:

1. An evaporation mask, comprising:
   shielding regions and evaporation regions arranged alternately, wherein the shielding regions are provided with shielding parts; and
   a baffle at least covering the evaporation regions,
   wherein the baffle includes a plurality of evaporation sub-regions, and a plurality of openings are provided in each evaporation sub-region;
   each of the plurality of evaporation sub-regions has an aperture ratio, and the aperture ratio is a ratio of an area of the opening in the evaporation sub-region to an area of the evaporation sub-region;
   the plurality of evaporation sub-regions include at least one first evaporation sub-region, and compared to other evaporation sub-regions, the at least one first evaporation sub-region has a smallest aperture ratio;
   the closer an evaporation sub-region to the at least one first evaporation sub-region, the smaller the aperture ratio of the evaporation sub-region;
   the baffle is fixed to the shielding parts through support, so that there is a gap between the baffle and the shielding parts; and
   the baffle is closer to an evaporation source than the shielding parts and the supports.

2. The evaporation mask according to claim 1, wherein the at least one first evaporation sub-region is circular and is located at a center position of the evaporation regions;
   the other evaporation sub-regions are annular and concentric with the at least one first evaporation sub-region, and surround the at least one first evaporation sub-region; and
   areas of the other evaporation sub-regions sequentially farther away from the at least one first evaporation sub-region sequentially increase.

3. The evaporation mask according to claim 1, wherein a height of the supports is in a range from 15 cm to 30 cm.

4. The evaporation mask according to claim 1, wherein an aperture of the openings in the at least one first evaporation sub-region is in a range from 4.5 mm to 6.5 mm.

5. The evaporation mask according to claim 1, wherein an aperture of the openings in the other evaporation sub-regions is in a range from 9.5 mm to 10.5 mm.

6. The evaporation mask according to claim 1, wherein a thickness of the baffle is in a range from 1.5 mm to 3.5 mm.

7. The evaporation mask according to claim 1, wherein, a material forming the baffle is a resin material or a metal material, and a tolerable temperature of the resin material or the metal material is greater than or equal to 200° C.

8. The evaporation mask according to claim 1, wherein the supports comprise telescopic rods configured to adjust a height of the supports.

9. The evaporation mask according to claim 1, wherein a number of the baffle is plural, and each of the baffles covers one of the evaporation regions.

10. The evaporation mask according to claim 1, wherein a number of the baffle is single, and the evaporation regions are covered by the single baffle.

11. An evaporation device, comprising the evaporation mask according to claim 1.

12. The evaporating device according to claim 11, further comprising an evaporation source, wherein, compared to the shielding parts, the baffle is closer to the evaporation source.

* * * * *